(12) United States Patent
Apfelbacher et al.

(10) Patent No.: US 7,405,550 B2
(45) Date of Patent: Jul. 29, 2008

(54) CONTROL INPUT CIRCUIT FOR AN ELECTRICAL DEVICE

(75) Inventors: Walter Apfelbacher, Freihung (DE); Norbert Reichenbach, Amberg (DE); Johann Seitz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 289 days.

(21) Appl. No.: 10/554,145

(22) PCT Filed: Mar. 30, 2004

(86) PCT No.: PCT/EP2004/003357

§ 371 (c)(1),
(2), (4) Date: Oct. 24, 2005

(87) PCT Pub. No.: WO2004/098059

PCT Pub. Date: Nov. 11, 2004

(65) Prior Publication Data

US 2006/0250222 A1 Nov. 9, 2006

(30) Foreign Application Priority Data

Apr. 25, 2003 (EP) .................................. 03009468

(51) Int. Cl.
*G05F 1/40* (2006.01)
*G05F 1/56* (2006.01)
(52) U.S. Cl. ...................................... 323/284; 323/271
(58) Field of Classification Search ................. 323/265, 323/268, 271, 282, 284, 285, 299, 300
See application file for complete search history.

(56) References Cited

U.S. PATENT DOCUMENTS

| 3,284,692 | A | * | 11/1966 | Gautherin | ...................... 363/45 |
| 4,893,228 | A | * | 1/1990 | Orrick et al. | ................... 363/98 |
| 4,949,359 | A | | 8/1990 | Voillat | |
| 5,179,488 | A | | 1/1993 | Rovner | |
| 5,705,919 | A | * | 1/1998 | Wilcox | ........................ 323/282 |
| 6,140,940 | A | | 10/2000 | Klofer et al. | |
| 6,236,193 | B1 | * | 5/2001 | Paul | ........................... 323/268 |
| 6,731,099 | B2 | * | 5/2004 | Inatomi et al. | .............. 323/284 |
| 7,135,844 | B2 | * | 11/2006 | Hane et al. | .................. 323/283 |
| 7,180,276 | B2 | * | 2/2007 | Telecco | ..................... 323/267 |

FOREIGN PATENT DOCUMENTS

| DE | 39 34 007 A | 4/1990 |
| EP | 0 294 139 A | 7/1988 |

* cited by examiner

*Primary Examiner*—Matthew V Nguyen
(74) *Attorney, Agent, or Firm*—Harness, Dickey & Pierce, P.L.C.

(57) ABSTRACT

A control input of an electrical device is disclosed, which is resistant to parasitic currents and which is especially suitable for a large bandwidth of various driving voltages. For this purpose, a control input circuit includes a constant current sink connected to a control line, whose current consumption during the duration of the detection pulse assumes a detection value relative which the power consumption between two successive detection pulses is reduced. The circuit also includes an evaluation module that analyzes the input current flowing in the control line and that indicates a control signal if, during the detection pulse, the input current does not fall below a predetermined switch-on value for a predetermined duty cycle.

21 Claims, 3 Drawing Sheets

CONTROL INPUT CIRCUIT FOR AN ELECTRICAL DEVICE

This application is the national phase under 35 U.S.C. § 371 of PCT International Application No. PCT/EP2004/003357 which has an International filing date of Mar. 30, 2004, which designated the United States of America and which claims priority on European Patent Application number EP 03009468.4 filed Apr. 25, 2003, the entire contents of which are hereby incorporated herein by reference.

FIELD

The invention generally relates to a control input circuit for an electrical appliance. A control input may be an electrical interface for an appliance, which interface can be used to send electronic control signals from an external control unit to the appliance provided with the control input. Such control signals can include turn-on and turn-off commands, for example. The appliance provided with the control input may be any electrical appliance which is able to detect and process electronic control signals, an electric motor unit, a measurement appliance, a data recording or reproduction appliance or the like for example. A control unit may be a programmable logic controller (PLC), for example.

BACKGROUND

The control signal may be produced by applying a control voltage to the control input of the appliance. In this context, the control input circuit associated with the control input has the task of recording the control current excited by the control voltage and, if a control signal is present, triggering an appropriate reaction to the control signal in the appliance.

Various control voltages are usual which differ in terms of voltage level and voltage form, particularly DC or AC voltage. In particular, the use of 24 V DC, 48 V DC, 110 V AC, 230 V AC etc. as control voltage is customary. In line with conventional nomenclature, DC stands for DC voltage and AC stands for AC voltage in this context.

To increase the compatibility of an appliance, and at the same time to have to provide the smallest possible number of different control inputs, it is the usual practice to design a control input for a bandwidth including a plurality of control voltages, e.g. for 24 V DC to 48 V DC or 110 V AC to 230 V AC. In this connection, it would be desirable to have a control input which is equally suitable for all common voltage levels and also for DC and AC voltages.

A conventional control input circuit with a purely nonreactive input characteristic can generally fulfill this not at all or only inadequately, especially since a rising control voltage usually means that it is also necessary to take account of a rising residual current which inevitably flows through the control line connecting the appliance to the control unit even when there is currently no control signal applied. In addition, this residual current is overlaid by interference currents which are transferred to the control line, particularly through capacitive interference injection. Such interference injection may arise, by way of example, when the control line is placed close to a network cable with only inadequate shielding. A control input circuit designed for wideband control voltages must imperatively have a comparatively low trigger threshold in order to trigger with certainty when a low control voltage is used.

On the other hand, however, a control input circuit with a nonreactive characteristic has an increased risk of the trigger threshold being exceeded. This is merely on account of the residual current and/or the interference current when a high control voltage is used.

To increase the wide bandwidth of a control input, from time to time a control input circuit is also used which contains a constant current sink. The term constant current sink is understood to refer to, for example, a circuit module whose drawn current is largely independent of the applied voltage within a prescribed voltage range. In the case of a control input circuit of the latter type, however, it is usually possible to set only a comparatively small drawn current in order to limit the maximum power loss arising in the control input circuit and the associated heating of the appliance to a tenable degree. The maximum drawn current which can be set without the need to provide complex overheating protection is in this case often too small to reach the minimum turned-on current demanded in accordance with the relevant standards, e.g. EN 61131-2: 1994.

SUMMARY

At least one embodiment of the invention includes an object of specifying a control input circuit for an electrical appliance whose voltage level and voltage form is suitable for a particularly large bandwidth of control voltages. In particular, the control input circuit in this case needs to be insensitive toward a capacitive interference current and needs to have low electrical loss. At least one embodiment of the invention also includes an object of specifying an electrical appliance with an improved control input.

At least one embodiment of the invention achieves the object via a control input circuit. The control input circuit accordingly includes a constant current sink with pulsed operation in terms of its drawn current. In this context, the drawn current assumes a detection value during the length of a detection pulse. Between two respective detection pulses at successive times, the drawn current is lowered in comparison with this detection value. To identify an applied control signal, the control input circuit also comprises an evaluation module. This is designed such that a control signal is indicated, i.e. particularly an internal appliance controller in the appliance is able to recognize when during the detection pulse the control current is not below a prescribed turned-on value for a prescribed turned-on period.

With regard to the appliance, at least one embodiment of the invention may also achieves an object. The control input of the appliance accordingly may include an inventive control input circuit associated with it.

The pulsed operation of the constant current sink reduces the average power loss arising at the control input to a comparatively low level, especially since the constant current sink permits an increased flow of current, and hence a significant power loss, only during the detection pulses. In a quiescent phase between two respective successive detection pulses, the drawn current is by contrast reduced to a low level. Thus, only a low power loss arises during the quiescent phase.

The heat loss which has arisen during the preceding detection pulse is therefore dissipated to a sufficient extent during the quiescent phase in just a simple way, in order to prevent the appliance from overheating. This in turn allows the drawn current during a detection pulse to be chosen to be particularly large, which lowers the control input circuit's susceptibility to interference from interference currents.

With an evaluation module which indicates the presence of a control signal only if during the prescribed turned-on time the control current is not below a prescribed turned-on value, interference influences can be masked out. The turned-on value is advantageously chosen to be slightly lower than the detection value of the drawn current, but high in comparison with the drawn current of the constant current sink during the quiescent phase. The turned-on period is in the order of magnitude of the detection pulse, but is preferably chosen to be somewhat shorter than the latter, in order to intercept edge rise times for the input voltage and the like.

To actuate the constant current sink, i.e. to prescribe the absolute value of the drawn current, it may have, for example, an actuation module connected to it. This is advantageously produced by an oscillator circuit whose total resistance alternates discretely between two values. Such a discrete oscillator circuit is also called an astable multivibrator (see U. Tietze, Ch. Schenk, Halbleiterschaltungstechnik [Semiconductor circuitry], 11th edition, Section 6.2.3, p. 603, 1999, Berlin (Springer Verlag)).

In a compact alternative which is favorable in terms of the complexity of parts, the actuation module provided is a microprocessor. This microprocessor expediently also performs other control functions for the appliance in addition to actuating the constant current sink.

In one preferred embodiment, the constant current sink has a diode connected upstream of it. This enhances the control input circuit in particularly simple fashion to pick up both DC voltage and AC voltage. With regard to the use of an AC voltage as control voltage, the additional advantage arises that the rectifying effect of the diode means that the control input circuit needs to be designed only for one voltage polarity. In addition, a current flows through the constant current sink only during that half-cycle of the control voltage whose polarity is in the forward direction of the diode, which assists in further reducing the power loss arising in the control input.

The evaluation module is particularly easily formed by an RC element which is charged when a control signal is applied. In this context, the RC element is proportioned such that the output voltage present across the RC element reaches a trigger value as soon as the control current is not below the prescribed turned-on value during the prescribed turned-on period. To mask out interference influences with certainty, the RC element advantageously has a threshold circuit connected upstream of it which is turned on only when the absolute value of the input current flowing in the control line exceeds a turned-on value.

In one simple and effective embodiment, the constant current sink is formed by a field effect transistor (FET) whose gate connection is placed at a constant voltage.

Preferably, the detection pulses are periodically successive in time. When a DC voltage is used as the control voltage, the period length is firmly prescribed by the actuation module in this case. When an AC voltage is used as the control voltage, on the other hand, the actuation module expediently coordinates (or synchronizes) the period of the detection pulses with the phase of the control voltage. In this context, the detection pulses are thus "triggered" by the control voltage. Thus, that the profile of the control voltage is always the same during the length of an arbitrary detection pulse. In particular, the actuation module is in a form such that the start of a detection pulse always coincides with the start of a positive half cycle of the control voltage. As a result, particularly low power loss arises, especially with a sinusoidal control voltage.

With a particularly advantageous design for the control input circuit with regard to common control voltages, i.e. particularly 24 V-230 V AC/DC, the drawn current of the constant current sink between two successive detection pulses is lowered by at least a factor of 10, particularly at least a factor of 20, in comparison with the detection value, whereas the turned-on value of the evaluation module is fixed at approximately 85% of the detection value.

In this context, the detection value is approximately 8 mA, in particular. The prescribed turned-on period, during which the input current needs to exceed the turned-on value in order to trigger a control operation, is at least 70%, preferably approximately 90% of the length of a detection pulse. In addition, the period of time between two successive detection pulses, i.e. the length of the quiescent phase, exceeds the length of a detection pulse by at least twofold. In particular, the length of the quiescent phase is approximately four times the length of a detection pulse. In this case, the length of a detection pulse is approximately 4 ms, in particular.

The numerical values and relations listed in the previous paragraph may also be used individually and in any combination as advantageous embodiments of the invention.

To attain a compact design for the control input circuit and low complexity of parts, the control input circuit or portions thereof are preferably in the form of an integrated circuit (ASIC).

The inventive control input circuit of at least one embodiment can be used particularly advantageously in an electrical appliance which can be actuated by electronic control signals. The use of the control input circuit in the appliance ensures a particularly high level of compatibility with various control units. The appliance equipped with the inventive control input circuit of at least one embodiment can be addressed particularly using all common control voltages, e.g. 24 V-230 V AC/DC, without requiring any specific adaptation of the control input. In this context, only a comparatively low power loss arises in the control input on average over time, even with a high control voltage, which means that no complex precautions for dissipating the heat loss are required. This allows inexpensive and compact implementation of the appliance.

BRIEF DESCRIPTION OF THE DRAWINGS

Example embodiments of the invention are explained in more detail below with reference to a drawing, in which.

Mutually corresponding parts and variables are always provided with the same reference symbol in the figures.

DETAILED DESCRIPTION OF THE EXAMPLE EMBODIMENTS

Figure 1:
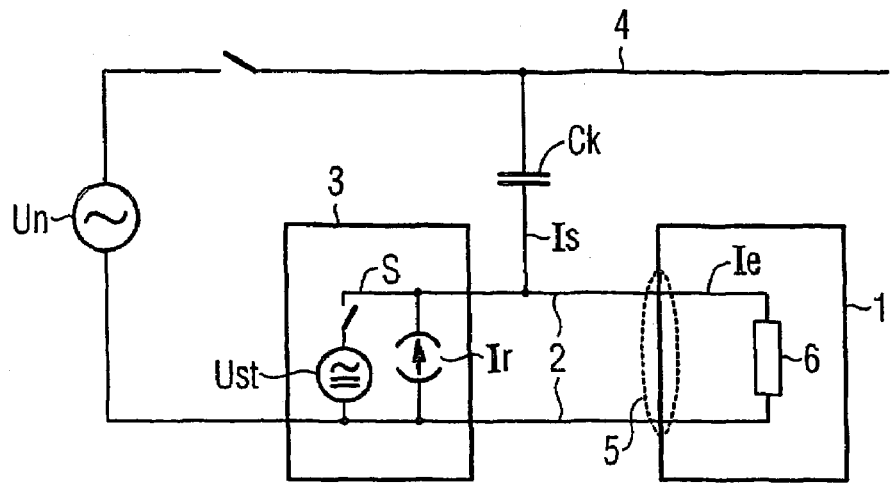
FIG. 1 schematically shows a switching arrangement with an electrical appliance and a control unit addressing the appliance via a control line.

FIG. 1 shows a coarsely schematic simplification of a switching arrangement with an electrical appliance 1 to which electronic control signals S are supplied from an external control unit 3 via a control line 2. The appliance 1 is an electronic motor unit, for example. The control unit 3 is a programmable logic controller, particularly a computer, for example.

The control unit 3 is for its part supplied with power via a main line 4 carrying a main voltage Un.

To produce a control signal S, the control unit 3 applies a control voltage Ust to a control input 5 of the appliance 1. With respect to the control line 2, the control input 5 forms the interface between the appliance 1 and the appliance exterior. The control voltage Ust used is either a DC voltage or an AC voltage.

In this context, the absolute value of the voltage or the voltage amplitude of the control voltage Ust is normally chosen to be between 24 V and 230 V, depending on the design of the control unit 3. The control voltage Ust is present across a control input circuit 6 connected into the control line 2 within the appliance 1. The control input circuit 6 analyzes the voltage which is present in the control line 2 and, when a control signal S is applied, actuates an internal appliance controller (not shown in more detail) as appropriate. The control signal S is a turn-on or turn-off command, for example. In this case, the appliance 1 is turned on or turned off when a control voltage Ust is applied.

When a control signal S is present, the control input circuit 6 has a comparatively large input current Ie flowing through it under the action of the applied control voltage Ust. When the control line 2 is not activated, i.e. in the absence of a control signal S, the absolute value of the input current Ie is by contrast reduced to a low level.

However, the input current Ie generally assumes an absolute value which is significantly different than zero even when a control signal S is absent. The reason for this is firstly a residual current Ir which inevitably appears within the control unit 3 and which secondly has an interference current Is overlaid on it. The interference current Is is injected into the control line 2 in predominantly capacitive fashion. This occurs, by way of example, as a result of the control line 2 being laid adjacent to the main line 4, if the latter is not sufficiently well shielded. The coupling capacitance Ck between the control line 2 and the main line 4 is indicated in the diagram shown in FIG. 1 by an equivalent circuit diagram in the form of a capacitor.

Figure 4:
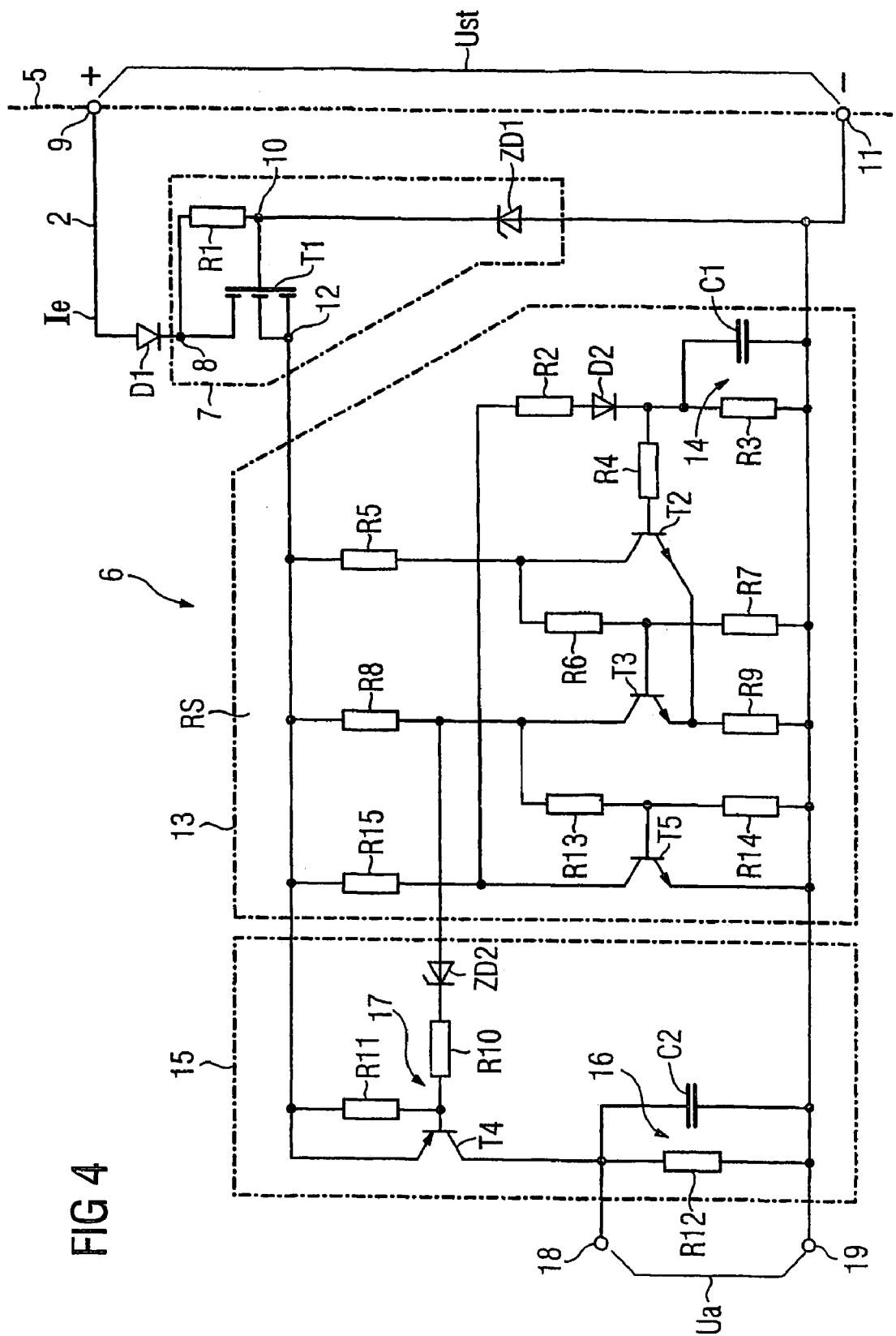
FIG. 4 shows an electronic circuit diagram of a control input circuit in the appliance.

The control input circuit 6 includes a constant current sink 7 connected into the control line 2 (FIG. 4). The constant current sink 7 holds the absolute value of the input current Ie at a constant absolute value, i.e. an absolute value which is essentially independent of the control voltage Ust, if this absolute value denoted as drawn current Ia is provided. The constant current sink 7 is operated in pulsed mode. In other words, the drawn current Ia is a function of time whose magnitude varies in pulsed fashion.

Figure 2:
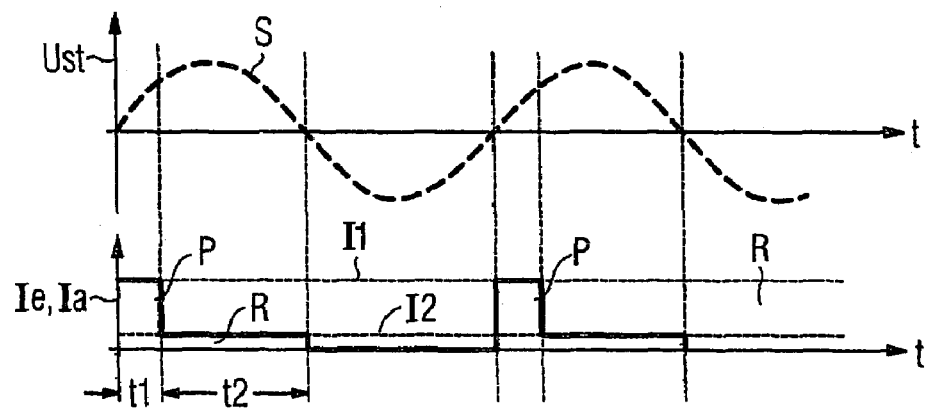
FIG. 2 shows a schematic diagram of the time profile of the control voltage and of the input current flowing in the control line during a control signal when a sinusoidal control voltage is used, FIG. 3 uses an illustration based on FIG. 2 to show the control voltage and the input current during a control signal with a control voltage which is constant over time.
Figure 3:
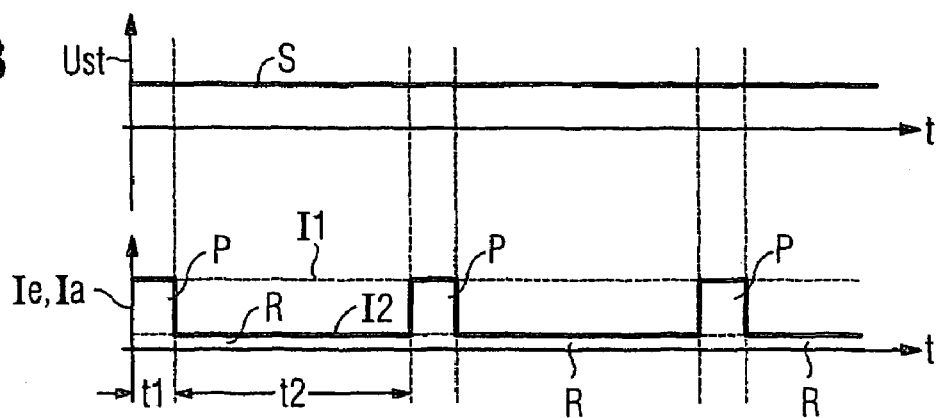

In practice, the constant current sink 7 has a comparatively high drawn current Ia during periodically recurring detection pulses P (FIGS. 2 and 3). During a detection pulse P which has a length t1 of 4 ms, for example, the drawn current Ia assumes a comparatively large value of approximately 8 mA, which is subsequently called detection value I1. The period of time between two successive detection pulses P is called quiescent phase R. During this quiescent phase R, the drawn current Ia of the constant current sink 7 is lowered significantly in comparison with the detection value I1, for example by a factor of 20, to a quiescent value I2. The length t2 of the quiescent phase R exceeds the length t1 of the detection pulse P by at least twofold, preferably even fourfold.

If a control signal S is present, a constant input current Ie=I1 flows almost during the entire length of the detection pulse P. During the subsequent quiescent phase R, the flow of current through the control input circuit 6 is limited to the quiescent value I2 at maximum, so that during the quiescent phase R in the control input circuit 6 only low power loss occurs. The average power loss occurring over time is therefore comparatively low, which effectively reduces the risk of the appliance 1 overheating, particularly in the region of the control input circuit 6.

This is explained in more detail in FIGS. 2 and 3. Both figures use a timing diagram to show a profile of the control voltage Ust during a control signal S in comparison with the corresponding input current Ie.

FIG. 2 shows the input current Ie which becomes established when using a sinusoidal AC voltage as control voltage Ust. The constant current sink 7 synchronizes itself, as described in more detail below, automatically with the phase of the control voltage Ust by virtue of a detection pulse P always being started at the start of the positive half cycle of the control voltage Ust. In other words, the detection pulses P are respectively "triggered" by the zero crossing of the control voltage Ust for the positive half cycle.

As FIG. 2 reveals, the drawn current Ia of the constant current sink 7 is switched down from the detection value I1 to the comparatively low quiescent value I2 after the detection pulse P, with the timing of the subsequent quiescent phase R extending at least over the entire residual length of the positive half cycle of the control voltage Ust. The absolute value of the input current Ie during the entire positive half cycle of the control voltage Ust corresponds to the drawn current Ia.

The control voltage Ust is rectified within the control input circuit 6, so that the flow of current in the control line 2 comes to a standstill during the negative half cycle of the control voltage Ust.

FIG. 3 shows the input current Ie, as becomes established for a control voltage Ust which is constant over time. In this case, the period of the recurring detection pulse P is prescribed internally by the control input circuit 6. A period comprises a detection pulse P of length t1 which is followed by a quiescent phase R of length t2.

While there is no control signal S applied to the control input 5, the input current Ie is necessarily equal to the sum of the residual current Ir and the interference current Is. This sum Ir+Is is generally small around the detection value I1 and fluctuates irregularly. During a detection pulse P, the input current Ie is therefore generally below the drawn current Ia=I1 prescribed by the constant current sink 7.

This value is reached for a short time at the outside, e.g. when a high interference voltage is briefly injected on account of a switching operation in the mains line 4 which provides coupling to the control line 2. The input current Ie can then reach the detection value I1 at most. However, the length of such interference influences is generally short around the length t1 of a detection pulse P, so that the input current Ie flowing on average over time during the detection pulse P continues to be small in comparison with the correspondingly averaged input current Ie which flows during a control signal S.

By evaluating the input current Ie flowing during a detection pulse P, it is therefore possible to distinguish a control signal S more or less clearly from interference influences. This principle for identifying a control signal S may be implemented in the control input circuit 6 described in detail below.

An example embodiment of the control input circuit 6 is shown in FIG. 4 in an electronic circuit diagram. The constant current sink 7 connected into the control line 2 accordingly has a diode D1 connected upstream of it for the purpose of rectifying the control voltage Ust.

The constant current sink 7 comprises a field effect transistor T1 whose drain connection 8 is connected to an input contact 9 of the control input 5. The drain connection 8 is connected via a resistor R1 to the gate connection 10 of the field effect transistor T1, which is in turn connected via a Zener diode ZD1 oriented in the reverse direction to an output contact 11 of the control input 5. In this circuitry, the gate connection 10 of the field effect transistor T1 has a constant voltage applied to it which fixes the input current Ie flowing through the field effect transistor T1 between the drain connection 8 and the source connection 12 at a constant value, i.e. the drawn current Ia.

The magnitude of the drawn current Ia is calculated from the breakdown voltage of the Zener diode ZD1 divided by the total resistance RS between the source connection 12 of the field effect transistor T1 and the output contact 11. To influence this total resistance RS, the source of the field effect transistor T1 has an actuation module 13 connected downstream of it.

The actuation module 13 includes three transistors T2, T3 and T5 which have connected resistors R2, R3, R4, R5, R6, R7, R8, R9, R13, R14 and R15, a diode D2 and a capacitor C1 as shown in FIG. 4.

The transistors T2, T3 and T5 are connected up such that during the detection pulse P only the transistor T3 is on, i.e. has a conducting collector/emitter path. In this context, the total resistance RS is essentially provided by the series circuit comprising the resistors R8 and R9. The detection value I1 of the drawn current Ia is thus essentially obtained from the breakdown voltage of the Zener diode DC1 divided by R8+R9.

In the quiescent phase R, on the other hand, the transistors T2 and T5 are on. The total resistance RS is then obtained approximately from the parallel circuit comprising the resistors R15 and R5. The quiescent value I2 of the drawn current Ia is thus provided approximately by the breakdown voltage of the Zener diode DZ1 divided by R15*R5/(R15+R5). Suitable circuit design achieves a situation in which the quiescent value I2 of the drawn current Ia is significantly smaller than the detection value I1. The length t1 of the detection pulse P and the length t2 of the quiescent phase R can be set independently of one another by stipulating the dimensions of the capacitor C1 and of the resistors R2 and R3.

When an AC voltage is used as control voltage Ust, the actuation module 13 restarts at the beginning of every positive half cycle. This is done by virtue of the RC element 14 formed by the resistor R3 and the capacitor C1 being charged via the resistor R15, the resistor R2 and the diode D2. In this context, the base voltage of the transistor T2 connected to the RC element 14 via the resistor R4 rises until said transistor is turned on after the length t1. This terminates the detection pulse P. The transistor T3, which had been on when the actuation module 13 started, is turned off by the transistor T2 which is turned on, and the transistor T5 which was off during the detection pulse P is in turn turned on when the transistor T3 is turned off. This shorts the output side of the resistor R15 to the output contact 11. The RC element 14 is now not charged any more, but rather discharges gradually via the resistor R3.

During the negative half cycle of the control voltage Ust, the flow of current breaks down. This causes the RC element to discharge completely. At the start of the next positive half cycle of the control voltage Ust, the process described above is repeated again.

With a constant control voltage Ust, the actuation module 13 oscillates periodically with the prescribed pulse/pause ratio between the detection pulse P and the quiescent phase R.

The actuation module 13 has an evaluation module 15 connected in parallel with it. The evaluation module 15 comprises an RC element 16 which is connected between the source output 12 of the field effect transistor T1 and the output contact 11 and which is formed from a resistor R12 and a capacitor C2. Connected between the field effect transistor T1 and the RC element 16 is a threshold circuit 17 which opens the connection between the RC element 16 and the field effect transistor T1 when the input current Ie exceeds a prescribed turned-on value.

To this end, the threshold circuit 17 uses a voltage divider circuit containing the resistors R10 and R11 and also a Zener diode ZD2 oriented in the reverse direction to pick off the voltage across the resistor R8 through which current flows during the detection pulse P. The threshold circuit 17 also includes a transistor T4 whose base is connected to the output potential of the resistor R11. The transistor T4 is turned on when the breakdown voltage of the Zener diode ZD2 is present across the resistor R8, and consequently current flows through the resistors R10, R11 and the Zener diode ZD2. The voltage which is present across the resistor R8 is proportional to the input current Ie flowing through the resistor R8. The breakdown voltage of the Zener diode ZD2 is in this case chosen such that the transistor T4 is turned on when the input current Ie corresponds to the turned-on value of approximately 85% of the detection value I1.

When the transistor T4 is on, the RC element 16 is charged. As a result, the voltage, present across the RC element 16 and which can be picked off at contacts 18 and 19 as output voltage Ua, rises gradually during the detection pulse P.

During the quiescent phase R, the input current Ie corresponds at most to the quiescent value I2 of the drawn current Ia. This quiescent value I2 is significantly below the turned-on value. Thus, further charging of the RC element 16 is prevented. The RC element 16 is consequently discharged via the resistor R12 during the quiescent phase R.

In the case of the present control signal S, the transistor T4 is for the largest part turned on during a detection pulse P. The output voltage Ua consequently reaches a comparatively high value at the end of the detection pulse P, said high value reaching a prescribed trigger threshold if the input current Ie is not below the turned-on value during a prescribed turned-on period. The turned-on period is chosen to be slightly shorter than the length t1 of the detection pulse P, in order to cushion edge rise times for the input current and the like. Preferably, the turned-on period is approximately 90% of the length t1.

The fact that the output voltage Ua reaches or exceeds the trigger threshold indicates that, again in a manner which is not shown in more detail, an internal appliance controller in the appliance 1, which appliance controller is connected to the contacts 18 and 19, recognizes the presence of the control signal S and triggers a reaction from the appliance 1 which is based on the control signal S.

If there is no control signal S present, the transistor T4 remains for the largest part turned off during the detection pulse P. The RC element 16 is thus largely not charged. As a result, the output voltage Ua remains at a very low value which is constantly below the trigger threshold, in particular.

Figure 5:
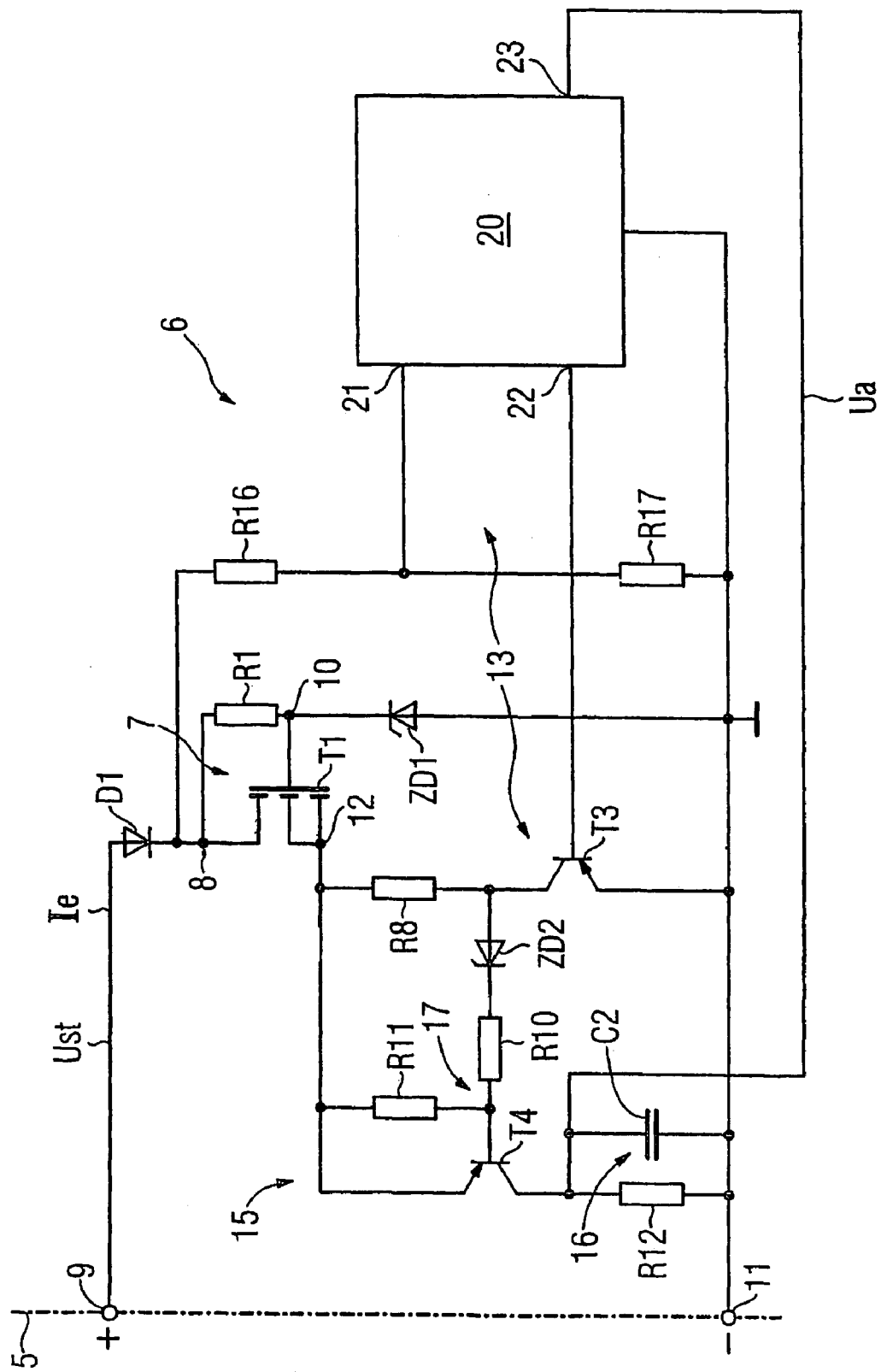
FIG. 5 shows an electronic circuit diagram of an alternative embodiment of the control input circuit.

In an alternative example embodiment of the control input circuit 6 shown in FIG. 5, a sub-function of the actuation module 13 is implemented in a microprocessor 20. The microprocessor 20 has a fraction of the rectified control voltage Ust across a voltage divider comprising resistors R16 and R17 supplied to it via a voltage input 21. The microprocessor 20 also has a control output 22 which it uses to actuate the transistor T3 on the basis of the control voltage Ust. In a similar fashion to the exemplary embodiment shown in FIG. 4, the transistor T3 is connected in series with the resistor R8 between the source connection 12 of the field effect transistor T1 and the output contact 11 of the control input 5. The transistor T3 is actuated by the microprocessor 20 such that a time profile for the input current Ie as shown in FIGS. 2 and 3 is obtained.

The input current Ie is analyzed by the evaluation module 15, whose design and manner of operation are unaltered in comparison with FIG. 4. However, the output voltage Ua is supplied to a trigger input 23 of the microprocessor 20. In this context, the microprocessor 20 simultaneously undertakes the function of an internal appliance controller and in this function actuates the appliance 1 in appropriate fashion when the output voltage Ua exceeds the prescribed trigger threshold.

The use of the term "module" for the functional groups of the control input circuit 6, particularly the actuation module 13 and the evaluation module 15, does not necessarily imply any physical separation of these groups. Rather, the entire control input circuit 6 or arbitrary parts thereof are preferably arranged in an arbitrary physical arrangement on a common circuit support. The control input circuit 6 or parts thereof are preferably in the form of an integrated circuit (ASIC).

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A control input circuit for an electrical appliance, comprising:
    a constant current sink, connected into a control line, whose drawn current assumes a detection value during the length of a detection pulse, the drawn current being lowered between two successive detection pulses; and
    an evaluation module that analyzes the input current flowing in the control line and indicates a control signal if during the detection pulse, the input current is not below a prescribed value for a prescribed period.

2. The control input circuit as claimed in claim 1, wherein an actuation module is connected to the constant current sink, which prescribes the magnitude of the drawn current.

3. The control input circuit as claimed in claim 1, wherein the actuation module is an oscillator circuit whose total resistance alternates discretely between two values.

4. The control input circuit as claimed in claim 1, wherein the actuation module includes a microprocessor.

5. The control input circuit as claimed in claim 1, wherein a diode is connected upstream of the constant current sink.

6. The control input circuit as claimed in claim 1, wherein the evaluation module comprises an RC element.

7. The control input circuit as claimed in claim 6, wherein a threshold circuit, connected upstream of the RC element, permits a flow of current to the RC element only if the input current exceeds the turned-on value.

8. The control input circuit as claimed in claim 1, wherein the constant current sink comprises a field effect transistor.

9. The control input circuit as claimed in claim 1, wherein the detection pulses are periodically successive in time.

10. The control input circuit as claimed in claim 9, wherein, when the control signal is in the form of a control voltage which alternates over time, the period of the detection pulses is coordinated with the phase of the control voltage.

11. The control input circuit as claimed in claim 10, wherein a respective detection pulse starts in coordination with each positive half cycle of the control voltage.

12. The control input circuit as claimed in claim 1, wherein the drawn current of the constant current sink between two successive detection pulses is lowered by at least a factor of ten in comparison with the detection value.

13. The control input circuit as claimed in claim 1, wherein the prescribed value of the input current corresponds to approximately 85% of the detection value.

14. The control input circuit as claimed in claim 1, wherein the prescribed period is at least 70% of the length of the detection pulse.

15. The control input circuit as claimed in claim 1, wherein the length of the period of time between two successive detection pulses exceeds the length of the detection pulse by at least twofold.

16. The control input circuit as claimed in claim 1, wherein the detection value is approximately 8 mA.

17. The control input circuit as claimed in claim 1, wherein the length of a detection pulse is approximately 4 ms.

18. The control input circuit as claimed in claim 1, wherein at least one of the actuation module and the evaluation module are in the form of an integrated circuit.

19. An electrical appliance comprising a control input circuit as claimed in claim 1.

20. The control input circuit as claimed in claim 2, wherein the actuation module is an oscillator circuit whose total resistance alternates discretely between two values.

21. The control input circuit as claimed in claim 2, wherein the actuation module includes a microprocessor.

* * * * *